United States Patent
Furukawa et al.

(10) Patent No.: US 8,017,954 B2
(45) Date of Patent: Sep. 13, 2011

(54) SEMICONDUCTOR LIGHT-EMITTING ELEMENT AND SEMICONDUCTOR LIGHT-EMITTING DEVICE

(75) Inventors: Chisato Furukawa, Fukuoka-ken (JP); Takafumi Nakamura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 716 days.

(21) Appl. No.: 12/027,544

(22) Filed: Feb. 7, 2008

(65) Prior Publication Data

US 2008/0192791 A1 Aug. 14, 2008

(30) Foreign Application Priority Data

Feb. 8, 2007 (JP) ................... 2007-029327

(51) Int. Cl.
  *H01L 33/00* (2010.01)
  *H01S 5/00* (2006.01)
(52) U.S. Cl. ............ 257/88; 257/89; 257/E33.065; 372/50.12
(58) Field of Classification Search ............ 257/79–103, 257/E33.065; 372/50.12
See application file for complete search history.

(56) References Cited

U.S. PATENT DOCUMENTS

| 5,115,284 | A | 5/1992 | Kawasaki |
| 5,115,285 | A | 5/1992 | Menigaux et al. |
| 6,351,069 | B1 * | 2/2002 | Lowery et al. ............... 313/512 |
| 6,984,841 | B2 * | 1/2006 | Tsuda et al. .................. 257/12 |
| 2003/0122145 | A1 * | 7/2003 | Linder et al. ................. 257/99 |
| 2004/0113164 | A1 * | 6/2004 | Corbet ......................... 257/95 |
| 2005/0205844 | A1 | 9/2005 | Uchida et al. |
| 2007/0147032 | A1 | 6/2007 | Furukawa et al. |

FOREIGN PATENT DOCUMENTS

JP  2000-275444  10/2000

OTHER PUBLICATIONS

German Office Action for 10 2008 007 935.9-33 issued on Feb. 11, 2010.

* cited by examiner

*Primary Examiner* — David S Blum
(74) *Attorney, Agent, or Firm* — Turocy & Watson, LLP

(57) ABSTRACT

According to an aspect of the invention, there is provided a semiconductor light-emitting element including a substrate, a first stripe, the first stripe including a first n-type clad layer, a first active layer and a first p-type clad layer on the substrate and a second stripe, the second stripe being formed on the substrate and having a different direction for the first stripe direction, the second stripe including a second n-type clad layer, a second active layer and a second p-type clad layer, the second n-type clad layer, the second active layer and the second p-type clad layer substantially being identical with the first n-type clad layer, the first active-layer and the first p-type clad layer, respectively.

17 Claims, 5 Drawing Sheets

US 8,017,954 B2

SEMICONDUCTOR LIGHT-EMITTING ELEMENT AND SEMICONDUCTOR LIGHT-EMITTING DEVICE

CROSS REFERENCE TO RELATED APPLICATION

This application is based upon and claims the benefit of priority from the prior Japanese Application (No. 2007-29327, filed Feb. 8, 2007), the entire contents of which are incorporated herein by reference.

FIELD OF THE INVENTION

The present invention relates to a semiconductor light-emitting element and a semiconductor light-emitting device.

DESCRIPTION OF THE BACKGROUND

Recently, a semiconductor light-emitting element as an optical source for white light laser such as a LED (Light Emitting Diode), a LD (Laser Diode) or the like has been developed. Many of the lights emitted from the LED or the LD as the optical source are blue, ultraviolet or the like, for example. Therefore, a method for obtaining white light laser has been examined. For example, a plurality of LED and LD are combined. For example, a plurality of LED and LD are combined. For another example, a conversion light for whitening is obtained by using a fluorescence material or the like.

A larger driving current can be flowed to the LD as comparing with the LED to obtain a larger light amount. Furthermore, the LD has characteristics that cause the spreading of the light to be small, for example. However, the light emitted from the LD is coherent so as to generate consideration for safety or the like.

For example, a semiconductor light-emitting device is disclosed in Japanese Patent Publication (Kokai) No. 2000-275444. The semiconductor light-emitting device is constituted with a semiconductor laser and a fiber-type optical wave guide doped with a fluorescence material. In the semiconductor light-emitting device, the fluorescence material is exited by the semiconductor laser being guided through the exiting fiber-type optical wave guide. The optical emission being emitted from the fluorescence material is output to an outer portion of the fiber-type optical wave guide.

The semiconductor light-emitting device disclosed in Japanese Patent Publication (Kokai) No.2000-275444 combines the emitted laser and the fiber-type optical wave guide. As a result, precise alignment in processing steps is required. Furthermore, much of the emitted laser is introduced into the fiber-type optical wave guide.

Further, the semiconductor laser of the semiconductor light-emitting device disclosed in Japanese Patent Publication (Kokai) No.2000-275444 is utilized by combining it with the fiber-type optical wave guide. Accordingly, the light emitted from the semiconductor laser device is usually output from only one direction. As the semiconductor light-emitting device is in a fiber state, the semiconductor light-emitting device may cause a limitation on how to use it as a light source.

SUMMARY OF THE INVENTION

According to an aspect of the invention, there is provided a semiconductor light-emitting element including a substrate, a first stripe, the first stripe including a first n-type clad layer, a first active layer and a first p-type clad layer on the substrate and a second stripe, the second stripe being formed on the substrate and having a different direction for the first stripe direction, the second stripe including a second n-type clad layer, a second active layer and a second p-type clad layer, the second n-type clad layer, the second active layer and the second p-type clad layer substantially being identical with the first n-type clad layer, the first active layer and the first p-type clad layer, respectively.

Further, another aspect of the invention, there is provided a semiconductor light-emitting device including a semiconductor light-emitting element, the semiconductor light-emitting element including a plurality of stripes and emitting light to at least four directions on a same plane, a lead, the lead being electrically connected with the semiconductor light-emitting element, a package body being a concave portion, the package body having a side-wall as a inner-side surface, the semiconductor light-emitting element being disposed on a center of a bottom surface in the concave portion, the light emitted from the stripes of the semiconductor light-emitting element being irradiated with the inner-side surface, a reflection film for ultraviolet at least on the inner-side surface and a fluorescence material on the reflection film being formed, and a cap substantially being transparent for visible-light and substantially being opaque against ultraviolet, the cap being disposed an upper portion of the semiconductor light-emitting element opposed to the bottom surface.

Further, another aspect of the invention, there is provided a semiconductor light-emitting device including a semiconductor light-emitting element, the semiconductor light-emitting element including a plurality of stripes and emitting light to at least four directions on a same plane, a lead, the lead being electrically connected with the semiconductor light-emitting element, a package body, the package body having a concave portion having a side wall of a reverse as a inner-side surface, the semiconductor light-emitting element being disposed on a center of a bottom surface in the concave portion, the light emitted from the stripes of the semiconductor light-emitting element being irradiated with the inner-side surface, a reflection film for ultraviolet at least on the inner-side surface and a fluorescence material on the reflection film being formed, and a cap substantially being transparent for visible-light and substantially being opaque against ultraviolet, the cap being disposed an upper portion of the semiconductor light-emitting element opposed to the bottom surface.

DETAILED DESCRIPTION OF THE INVENTION

Figure 1A:
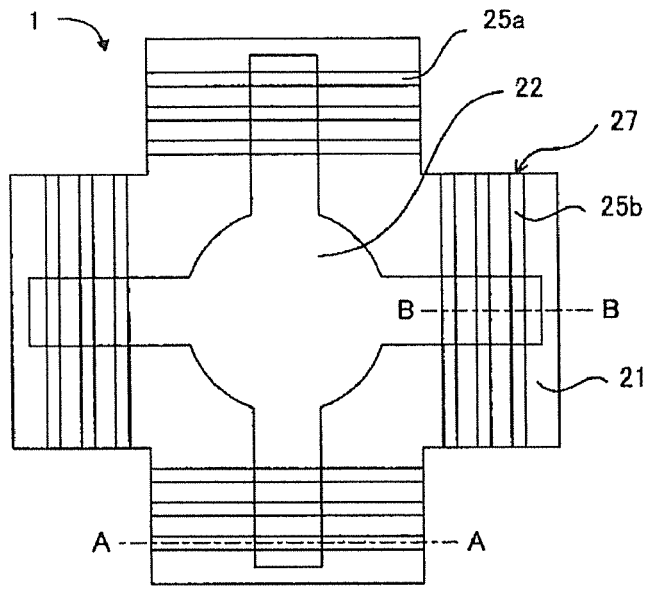
FIGS. 1A, 1B and 1C are a schematic plane view, a schematic cross-sectional view along the line A-A of FIG. 1A and a schematic cross-sectional view along the line B-B of FIG. 1A, respectively showing a structure of a semiconductor light-emitting element according to a first embodiment in the present invention.

Embodiments of the present invention will be described below in detail with reference to the drawings mentioned above.

It is to be noted that the same or similar reference numerals are applied to the same or similar parts and elements throughout the drawings, and the description of the same or similar parts and elements will be omitted or simplified.

First Embodiment

First, according to a first embodiment of the present invention, a semiconductor light-emitting element and a semiconductor light-emitting device are explained with reference to FIGS. 1-2. FIGS. 1A, 1B and 1C are a schematic plane view, a schematic cross-sectional view along the line A-A of FIG. 1A and a schematic cross-sectional view along the line B-B of FIG. 1A, respectively, showing a structure of a semiconductor light-emitting element according to the first embodiment in the present invention. FIGS. 2A and 2B are a schematic plane view and a schematic cross-sectional view along the line C-C of FIG. 2A, respectively, showing the structure of the semiconductor light-emitting device according to the first embodiment in the present invention.

Figure 1B:
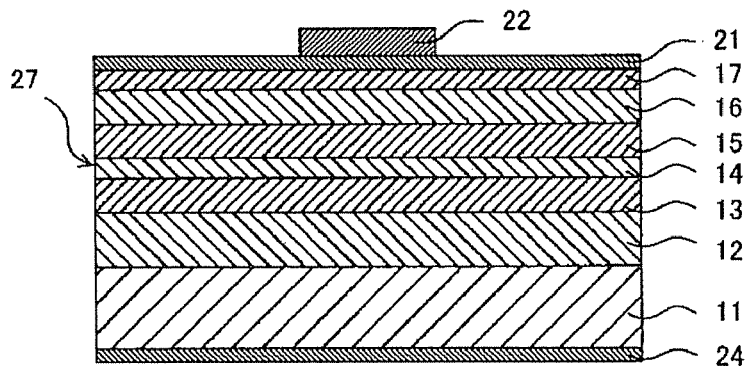
Figure 2A:
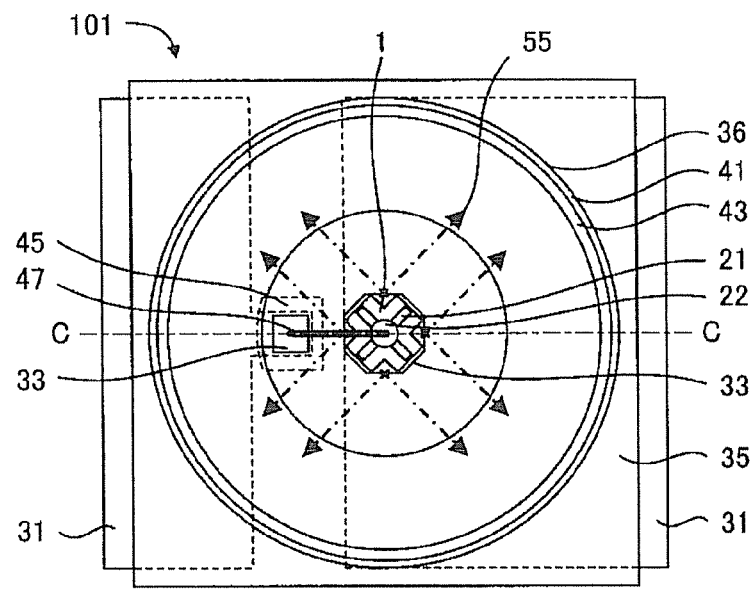
FIGS. 2A and 2B are a schematic plane view and a schematic cross-sectional view along the line C-C of FIG. 2A, respectively, showing the structure of the semiconductor light-emitting device according to the first embodiment in the present invention.
Figure 2B:
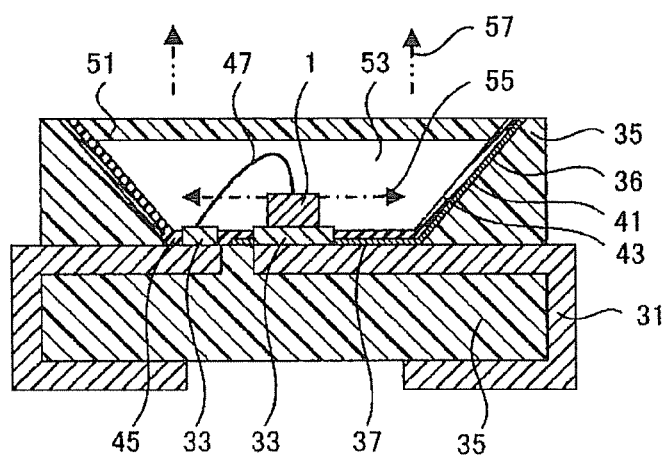

As shown in FIG. 1B, a semiconductor light-emitting element 1 includes an n-type semiconductor substrate 11 as a substrate, a stripe 25a as a first stripe, a stripe 25b as a second stripe as same as the stripe 25a, a p-side electrode 21 and a pad electrode 22 of an upper surface, and an n-side electrode 24 of a bottom surface. The stripe 25a includes a resonator of a semiconductor laser being extended to the horizontal direction as shown in FIG. 1A. The stripe 25b also includes the resonator of a semiconductor laser being extended to the longitudinal direction as shown in FIG. 1A. Further, the stripe 25a and the stripe 25b have an approximately the same constitution each other, therefore, the stripe 25a and the stripe 25b are called the stripe 25 when treating as the same stripe.

As shown in FIG. 1, the semiconductor light-emitting element 1 has a wide crossing-shape. The pad electrode 22 being a circle-shape is configured at a center of the crossing-shape having a vertical line area extended to the longitudinal direction and a horizontal line area being extended to the horizontal direction. The extending portion of the pad electrode 22 is configured at the center portion of the vertical line area and the horizontal line area. Two pairs of the three stripes 25a and two pairs of the three stripes 25b are formed at the four periphery portion of the crossing-shape and are approximately perpendicularly crossed with the vertical line area of the pad electrode 22 in the case of the three stripes 25a and the horizontal line area of the pad electrode 22 in the case of the three stripes 25b, respectively. Accordingly, the semiconductor light-emitting element 1 has the twelve stripes 25. The three stripes 25a and the three stripes 25b respectively are configured in parallel and are separated each other with a prescribed distance. The twelve stripes 25 are configured without crossing each other. The stripes 25a and the stripes 25b are symmetrically configured each other to the center of the pad electrode 22 and to a plane passing through the center of the pad electrode 22.

Figure 1C:
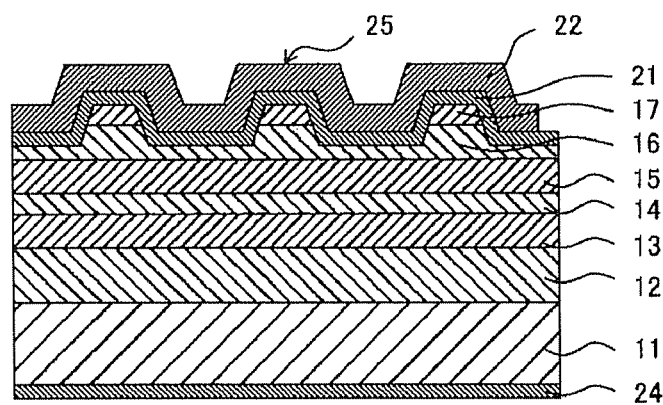

As shown in FIGS. 1B and 1C, an n-type semiconductor substrate 11 composed of GaN with R-plane, an n-type buffer layer 12 GaN, an n-type clad layer 13 composed of GaN, an active layer 14 composed of InGaN, a p-type clad-layer 15 composed of GaN, a p-type current diffusion layer 16 and a p-type contact layer 17 composed of GaN, are stacked in layer in the semiconductor light-emitting element 1 by MOCVD (Metal Organic Chemical Vapor Deposition) or the like. A peak wave length of an emission light is favorable at below approximately 400 nm, therefore, is set at approximately 370 nm. Furthermore, the active layer 14 can be constituted with a quantum well structure being alternately stacked with a GaN barrier-layer and an InGaN well-layer. An optical guide-layer composed of GaN or the like can be appropriately inserted into the semiconductor light-emitting element 1.

A p-type current diffusion layer 16 and a p-type contact layer 17 are formed as a ridge-shape with prescribed widths and are constituted as a ridge wave guide. On an upper portion of the ridge, the p-type contact layer 17 is formed. The p-side electrode 21 composed of Ti/Pt/Au and the pad electrode 22 composed of Au for bonding are stacked in layer on the p-type current diffusion layer 16 and the p-type contact layer 17. The n-side electrode 24 composed of Al/Ni/Au is formed at a bottom of the n-type semiconductor substrate 11.

An electrical pass is formed from the pad electrode 22 and the p-side electrode 21 via the p-type contact layer 17 and p-type current diffusion layer 16 into the portion being formed with the ridge. A laser is mainly emitted in the p-type clad-layer 15, the active-layer 14 and the n-type clad-layer 13 at a lower portion of the ridge by injecting electrical current. The stripe indicates a portion related the reed-shaped laser oscillation being along the ridge from a plan view point. The twelve stripes 25 have the same height and the same stacked-structure for the n-type semiconductor substrate 11. In the n-type semiconductor substrate 11 having R-plane as the crystal plane, the stripes 25 are formed so that the two directions are nearly equal in laser emission each other. Furthermore, the n-type semiconductor substrate 11 is not restricted as the R-plane and the substrate 11 can have a crystal plane which can provide more equivalent two directions for forming the stripes.

Both end portions of the stripe 25 in the longitudinal direction are end surfaces 27 in the resonator of the laser emission, for example, the both end portions are formed by RIE (Reactive Ion Etching). The both end portions are parallel each other and have a flat and smooth plane. The resonator, which is Fabry-Perot type, can emit the laser from the both end. Furthermore, an optical film is formed on the both end portions 27 to be able to control amount of the light emission. Moreover, the both end portions of the stripe 25 in the longitudinal direction have a structure in which a portion from the upper p-type side electrode 21 to the lower n-type semiconductor substrate 11 is eliminated. However, except the both end portions 27 and a pass where the emitted laser is preceded, for example, bottom surface-side of the n-type semiconductor substrate 11 may residue without the elimination.

As shown in FIG. 2, a semiconductor light-emitting device 101 includes a semiconductor light-emitting element 1, a lead 31, a package body 35 being a concave portion with a reverse circular truncated cone and having an inner-side surface 36 and a bottom surface 37, and a cap 51 being substantially opaque against ultraviolet and substantially transparent for visible-light. The semiconductor light-emitting element 1 has the stripes 25 being able to emit the laser to four directions. The lead 31 is connected with the semiconductor light-emitting element 1. The semiconductor light-emitting element 1 is disposed on the center of the bottom surface 37. A fluorescence film 43 as a reflection film 41 against ultraviolet is formed on the inner-side surface 36 and the bottom surface 37 of the package body 35. The cap 51 is set at the upper portion of the semiconductor light-emitting element 1 opposed to the bottom surface 37.

Furthermore, the stripe 25 of the semiconductor light-emitting element 1 being configured in the semiconductor light-emitting device 101 is positioned above a surface of the fluorescence film 43 being formed on the bottom surface 37. The direction of the stripe 25 is faced to the fluorescence film 43 and the reflection film 41 being formed on the inner-side surface 36 of the package body 35 through a space 53 in the concave portion. Accordingly, the maximum strength of the laser emitted from the stripe is set to the direction of the inner-side surface 36.

The two leads 31 being rectangular without one side are apart with each other and being interposed a resin constituting the package body 35. The leads 31 constitute with a part of the bottom surface 37 of the concave portion. A higher protrusion 33 is formed at a portion being connected with a wire 47 in the semiconductor light-emitting element 1. The semiconductor light-emitting element 1 is connected with the protrusion 33 of one of the leads 31 via the n-side electrode 24 and is connected with the protrusion 33 of the other lead 31 via the electrode pad 22 and the wire 47 for bonding. The wire 47 is disposed without blanking the laser emitted from the semiconductor light-emitting element 1. The leads 31 and the protrusion 33 is constituted with a lead-frame material composed of Cu or a metal including Cu, Fe or the like as a main component.

The package body 35 is formed by a mold-resin having an epoxy-resin as a main component. Furthermore, the package body 35 may be constituted with a composite with a resin except epoxy-resin, a ceramic or the like. The semiconductor light-emitting device 101 is the same figure as a conventional SMD (Surface-Mounted Device) of a LED as a semiconductor light-emitting element 1 so that the semiconductor light-emitting device 101 can be fabricated in nearly the same processing steps as the conventional semiconductor light-emitting device with a comparatively easy method.

A metal with high reflection ratio to ultraviolet such as at least Al, Ag and Pt or the like as the reflection film 41 on the inner-side surface 36 and the bottom surface 37 is formed at the near side the stripe 25. The fluorescence material 43 having capability of emitting red, green, blue by mixing as a film is formed on the reflection film 41 as a conversion light 57 of a white light laser. An eliminated portion 45 on the bottom surface 37 and the inner-side surface 36 at periphery of the protrusion 33 for bonding is formed without electrically shorting with the leads 31 by the reflection film 41.

The fluorescence material 43 covers on the inner-side surface 36 and the bottom surface 37 except a surface of the protrusion 3. The fluorescence material 43 has comparatively high emitting efficiency as an exiting light 55 of the laser in the semiconductor light-emitting element 1. For example, $La_2O_2S$:Eu, Sm as red, $Y_2SiO_5$:Ce, Tb as green and $(Sr, Ca, Ba, Eu)_{10}(PO_4)_6Cl_2$ as blue are suitable. The laser emitted from the stripe 25 is irradiated with the fluorescence material 43 and is reflected on the reflection film 41 so that the laser again emitted from the surface of the fluorescence material 43. Therefore, the film thickness of the fluorescence material 43 is formed to obtain high probability as the conversion light 57, for example, the thickness of 10 μm being more or less when the fluorescence material 43 has 1-3 μm diameter of the grain.

The cap 51 being a board is disposed at a position being opposed to the pad electrode 22 of the semiconductor light-emitting element 1 in the upper of the inner-side surface 36. The cap 51 is composed of a glass-material substantially being opaque against ultraviolet and substantially being transparent for visible-light, for example, a soda-glass, a glass material or the like with a surface being formed a film substantially being opaque against ultraviolet and substantially being transparent for visible-light. Further, not restricted to the glass, a plastic material having the same property as the glass or a plastic having a film with the same property on the surface may be suitable. The semiconductor light-emitting element 1 is disposed in a space 53 where surrounded by fluorescence material on the inner-side surface 36, the bottom surface 37 or the like. The space 53 is filled with air. As another case, an inert gas can be also utilized or the gases having reduced pressure can be also utilized.

As mentioned above, the twelve stripes 25 having the resonator of the semiconductor laser extended to two directions, the horizontal direction and the longitudinal direction being different about 90 degrees each other, are formed in the semiconductor light-emitting element 1 without crossing each other on the n-type semiconductor substrate 11. Further, the semiconductor light-emitting element 1 includes p-side electrode 21 and pad electrode 22 at the upper surface, and n-side electrode 24 being at the bottom surface. Consequently, the semiconductor light-emitting element 1 can emit the laser to four different directions of ninety degrees one another. Further, the semiconductor light-emitting element 1 includes twelve stripes 25 so as to be able to obtain larger light amount as comparing with a semiconductor light-emitting element having one stripe.

Further, the semiconductor light-emitting device 101 includes the semiconductor light-emitting element 1, the lead 31, the package body 35 being a concave portion with a reverse circular truncated cone and having an inner-side surface 36 and a bottom surface 37, and the cap 51 being in transparent against ultraviolet and substantially transparent for visible light. The semiconductor light-emitting element 1 has the twelve stripes 25 being able to emit the laser to four directions. The maximum strength of the laser emitted from the twelve stripes 25 is directed to the inner-side surface 36. The lead 31 is connected with the semiconductor light-emitting element 1. The semiconductor light-emitting element 1 is disposed on the center of the bottom surface 37. The fluorescence film 43 is the reflection film 41 against ultraviolet is formed on the inner-side surface 36 and the bottom surface 37 of the package body 35. The cap 51 is set at the upper concave portion opposed to the semiconductor light-emitting element 1.

Next, an operation of the semiconductor light-emitting device 101 is explained. Electrical current is injected from the lead 31 of the semiconductor light-emitting device 101 to operate the semiconductor light-emitting element 1. The laser is emitted from the semiconductor light-emitting element 1 to the four directions along the stripes 25. The laser is irradiated with the mixed fluorescence material 43 on the inner-side surface 36 to emit a conversion light 57 of red, green and blue, therefore, the conversion light 57 optically being white. The conversion light 57 is directly reflected from the surface of the fluorescence material 43, the reflection film 41 or the like and much of the light is emitted from the cap 51. A part of the exiting light 55 being not absorbed by the fluorescence material 43 is reflected on the reflection film 41 or the like and is reflected on the cap 51 to be absorbed by the fluorescence material 43 and emit the conversion light 57. Further, the part of an exiting light 55 being not absorbed by the fluorescence material 43 is absorbed by the cap 51.

Consequently, the selected fluorescence material 43 has high conversion efficiency to the laser being narrower on wavelength spreading. The selected fluorescence material 43 can effectively absorb the laser to form the conversion light 57, as a result, the semiconductor light-emitting device 101 can obtain much more white light laser. As the laser emitted from the twelve stripes 25 can irradiate the twenty-four inner-side surfaces 36, namely, irradiate in dispersion with the fluorescence material 43 on the inner-side surfaces 36, the semiconductor light-emitting device 101 can obtain much more white light laser without degradation of the conversion efficiency by concentration of the exiting light 55. Furthermore, the laser emitted from the twelve stripe 25 can be irradiated with the twenty-four inner-side surfaces 36 in dispersion, namely, irradiated with the fluorescence material 3 on the inner-side surfaces 36 to obtain the conversion light 57. Therefore, the semiconductor light-emitting device 101 can be an optical source with a homogeneous light-distribution characteristic and has less strength imbalance of the conversion light 57 due to the position in the inner-side surface 36.

Figure 3:
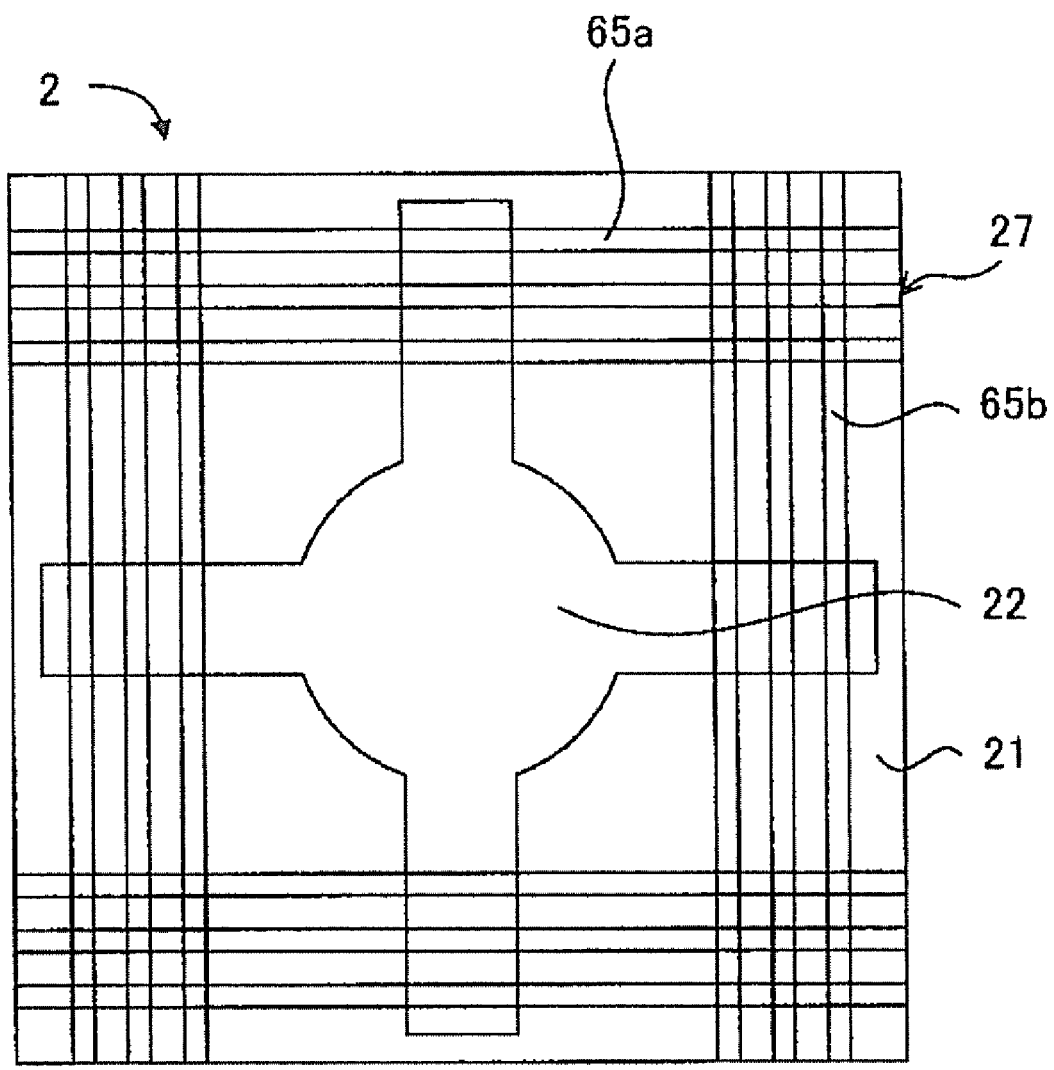
FIG. 3 is a schematic plane view showing a structure of a semiconductor light-emitting element according to a first modification of the first embodiment in the present invention.

Furthermore, a first modification of the first embodiment in the present invention is explained with reference to FIG. 3, which is a plain view showing a structure of a semiconductor light-emitting element 2. As shown in FIG. 3, the semiconductor light-emitting element 2 is a square and stripes 65 are extended to four periphery portion of the square to cross each other. The plane view mentioned above is a different portion from the first embodiment, therefore, the different portion with the first embodiment is described in detail.

The semiconductor light-emitting element 1 has the twelve stripes 65. Three stripes 65*a* and three stripes 65*b* are configured in parallel and separated each other with a prescribed distance. Each of the stripes 65 is sequentially crossed with the three stripes 65 at a diagonal position to the square. Each of the stripes is crossed at six portions at each corner. The stripes 65 are extended to the both ends on which the end surface 27 of a resonator on laser emission is formed. The extended length may be nearly added distance between the adjusting stripes 65 crossed each other as comparing with the first embodiment. Further, the length of the stripe 65 is adjusted for a length being suitable as the semiconductor light-emitting element 2.

A semiconductor light-emitting device (not illustrated) in the first modification of the first embodiment can be formed by replacing the semiconductor light-emitting element 1 in the first embodiment with the semiconductor light-emitting element 2.

As a result, the semiconductor light-emitting element 2 has the same effect as the semiconductor light-emitting element 1 in the first embodiment. The semiconductor light-emitting device disposing the semiconductor light-emitting element 2 has the same effect as the semiconductor light-emitting device 101 in the first embodiment. As another effect, the semiconductor light-emitting element 2 in the first modification has a rectangular parallelepiped with less protrusion and no inlet angles, therefore, can easily be assembled in assembly processes of a semiconductor light-emitting device.

Further, as the embodiment in the present invention, the second modification is the same as the semiconductor light-emitting element 2 in the plan view, however, the semiconductor light-emitting device having layered structure and a stripe structure being different from the semiconductor light-emitting element 2 can be constituted in the second modification. A figure is not illustrated, however, the semiconductor light-emitting element in the second modification is mentioned below. The layers are formed the same layered structure of the semiconductor light-emitting element 1 in the first embodiment till the p-type clad layer 15. Then, a diffraction grating with emission wave length of about 370 nm is formed on the p-type clad layer 15. The n-type clad layer, the active layer 14 and the p-type clad layer 15 at a portion crossing the stripes is removed. A p-type guide layer composed of GaN is additionally formed on the removed portion and the diffraction grating. Further, the layered structure post p-type current diffusion layer 16 is formed on the p-type guide layer as the same as the semiconductor light-emitting element 1 in the first embodiment. As the resonator is DFB (Distributed Feedback) type, the both ends of the stripe is not necessary in parallel and flat.

The semiconductor light-emitting device (not illustrated) in the second modification can be formed by replacing the semiconductor light-emitting element 1 in the first embodiment with the semiconductor light-emitting element in the second modification.

As a result, the semiconductor light-emitting element of the second modification has the same effect as the semiconductor light-emitting element 2 in the first modification. The semiconductor light-emitting device disposing the semiconductor light-emitting element in the second modification has the same effect as the semiconductor light-emitting device in the first modification. As another effect, the semiconductor light-emitting device in the second modification has a sharp emission wave length distribution of about 370 nm to be able to obtain much more white light by higher conversion efficiency of the fluorescence material.

Second Embodiment

Figure 4:
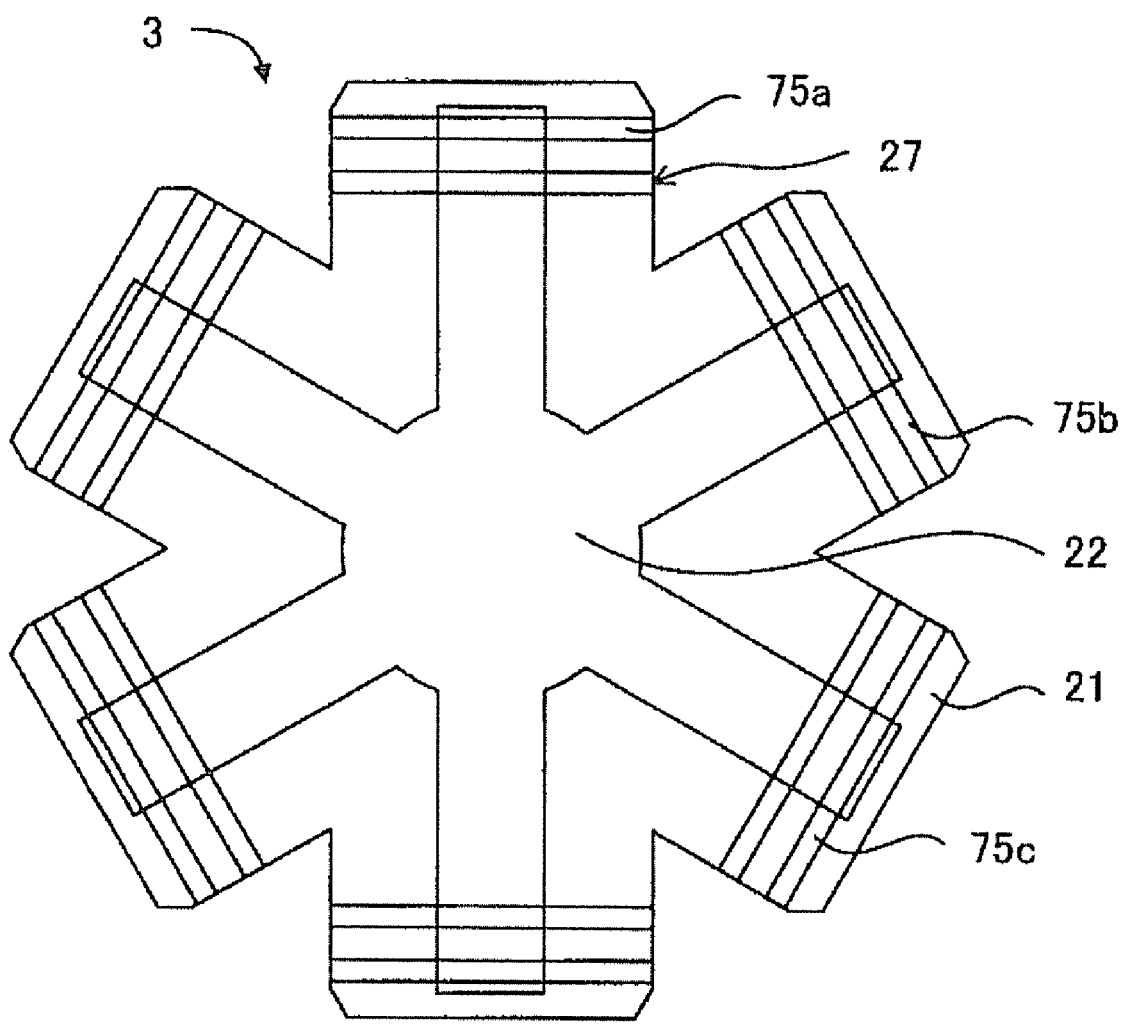
FIG. 4 is a schematic plane view showing a structure of a semiconductor light-emitting element according to a second embodiment in the present invention.

A semiconductor light-emitting element and a semiconductor light-emitting device according to a second embodiment of the present invention are explained with reference to FIG. 4. FIG. 4 is a schematic plan view showing a structure of the semiconductor light-emitting element. A different point as comparing with the first embodiment is that stripes towards to three directions are formed. Throughout attached drawings in the second embodiment, similar or same reference numerals in the first embodiment show similar, equivalent or same components.

As shown in FIG. 4, a semiconductor light-emitting element 3 includes a stripe 75*a*, a stripe 75*b* and a stripe 75*c*. The stripe 75*a* is extended to the horizontal direction in the figure, the stripe 75*b* is extended to a direction rotated from approximately 120 degrees from the stripe 75*a* and the stripe 75*c* is extended to a direction rotated approximately 240 degrees from the stripe 75*a*. The semiconductor light-emitting element 3 includes the p-side electrode 21 and the pad electrode 22 at the upper surface, and n-side electrode 24 at the bottom surface as the same as the semiconductor light-emitting element 1 in the first embodiment.

The semiconductor light-emitting element 3 in the plan view is constituted with an asterisk-shape which shares three rectangular-portions in a center region. The three rectangular-portions are configured to shift 120 degrees each other. The pad electrode 22 with a circle-type is disposed in the center portion. Each of the rectangular-portions with a narrower width being connected with the pad electrode 22 is formed as an extend portion from the center of the asterisk-shape. The semiconductor light-emitting element 3 includes twelve stripes 75. Two pairs of the two stripes 75*a*, two pairs of the two stripes 75*b* and two pairs of the two stripes 75*c* are formed at six periphery portion of the asterisk-shape to be perpendicularly crossed with the extend portions of the pad electrode 22. Each of two stripes 75, respectively, is configured in parallel and separated each other in a prescribed distance without crossing each other. Accordingly, the twelve stripes 25 are configured without crossing each other. Twelve angles of an outer periphery portion in the asterisk-shape are eliminated without crossing with an extending line of the stripes 75.

The semiconductor light-emitting element 3 is formed on the n-type semiconductor substrate having R-plane as the same as the first embodiment. Furthermore, the semiconductor light-emitting element 3 can include the stripes 75 with an equivalent properties in different directions of 120 degrees by using C-plane. The both end portions of the stripe 25 in the longitudinal direction is the end surface 27 in a resonator of laser emission, for example, is formed by RIE (Reactive Ion Etching). The both end portions are parallel each other and have a flat and smooth plane.

A semiconductor light-emitting device (not illustrated) in the first modification can be formed by replacing the semiconductor light-emitting element 1 in the first embodiment with the semiconductor light-emitting element 3.

As a result, the twelve stripes 75 in the semiconductor light-emitting element 3 share the resonator of the semiconductor laser extending to three directions without crossing each other. The semiconductor light-emitting element 3 can emit the laser for six directions. Each of the directions has a difference of approximately 120 degrees. The semiconductor light-emitting element 3 has the same effect as the semiconductor light-emitting element 1 in the first embodiment. Furthermore, an angle distance emitting the laser can be set at 60 degrees being smaller than 90 degrees.

The semiconductor light-emitting device disposing the semiconductor light-emitting element 3 has the same effect as the semiconductor light-emitting device 101 in the first embodiment. As another effect, twenty-four inner-side surfaces, namely the fluorescence material coated on the inner-side surface, can be irradiated in dispersion as the same case of the semiconductor light-emitting device 101. However, as the semiconductor light-emitting element 3 can emit the laser to the six directions, the semiconductor light-emitting element 3 can obtain the conversion light by irradiating the fluorescence material on the inner-side surface in more dispersion. As the semiconductor light-emitting device in this embodiment as comparing with the semiconductor light-emitting device 101 has fewer imbalances by a position of the inner-side surface in conversion light strength, the semiconductor light-emitting device may be a light source with uniform light-distribution characteristics.

Figure 5:
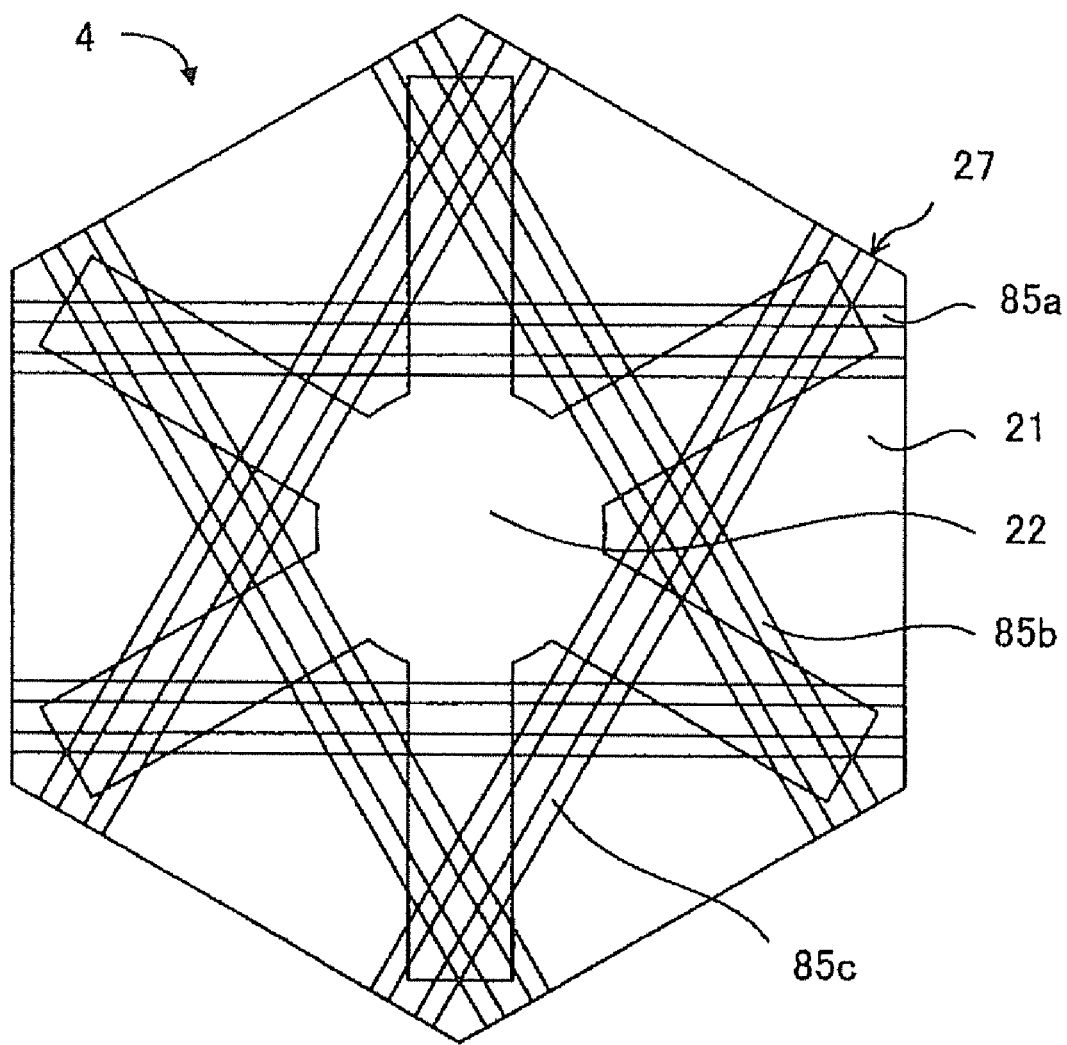
FIG. 5 is a schematic plane view showing a structure of a semiconductor light-emitting element according to a first modification of the second embodiment in the present invention.

Furthermore, a first modification of the second embodiment is described with reference to FIG. 5 which is schematic plan view showing a structure of a semiconductor light-emitting element. As shown in FIG. 5, a semiconductor light-emitting element 4 is a regular hexagonal-shape. The semiconductor light-emitting element 4 has ends of stripes 85 on the fringes opposed to each other near the angle. Each of the stripes 85 being crossing is a different point to the second embodiment. Explanation mentioned below is only on the difference from the second embodiment.

The semiconductor light-emitting element 4 has a pad electrode with the circle-shape in a center of the regular hexagonal-shape and is extended to portions of the pad electrode 22 extending to an angle direction of the periphery. Stripes 85*a*, stripes 85*b* and stripes 85*c* totally are formed twelve stripes and are constituted with a group by two stripes having a prescribed distance each other, respectively. The twelve stripes are perpendicularly crossing with the extend portion of the pad electrode 22 by 120 degrees or 240 degrees so as to avoid beneath the pad electrode 22 with the circle-type in the center of the regular hexagonal-shape.

A semiconductor light-emitting device (not illustrated) in the first modification of the second embodiment can be formed by replacing the semiconductor light-emitting element 1 in the first embodiment with the semiconductor light-emitting element 4.

As a result, the semiconductor light-emitting element 4 has the same effect as the semiconductor light-emitting element 3 in the second embodiment. The semiconductor light-emitting device disposing the semiconductor light-emitting element 4 has the same effect as the semiconductor light-emitting device in the second embodiment.

Moreover, as the second modification of the second embodiment, a layered structure and a diffraction grating can be formed to be constituted as a semiconductor light-emitting element having a DFB-type resonator as the same as the second modification of the first embodiment.

A semiconductor light-emitting device (not illustrated) in the second modification of the second embodiment can be formed by replacing the semiconductor light-emitting element 1 with the semiconductor light-emitting element in this modification.

As a result, the semiconductor light-emitting element in this modification has the same effect as the semiconductor light-emitting element 2 in the first modification of the second embodiment. The semiconductor light-emitting device disposing the semiconductor light-emitting element in this modification has the same effect as the semiconductor light-emitting device in the first modification. As another effect, the semiconductor light-emitting device in this modification has a sharp emission wave length distribution of about 370 nm to be able to obtain more white light by higher conversion efficiency of the fluorescence material.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, in the embodiments and the modifications, the semiconductor light-emitting element is formed on an n-type semiconductor substrate by crystal growth. However, the semiconductor light-emitting element can be formed on an insulative substrate by crystal growth. In the case of crystal growth on the insulative substrate, at least two electrodes are necessarily formed on the upper surface of the semiconductor light-emitting element. Positions of a pad electrode, a lead shape being connected with the pad electrode or the like are essentially changed in a semiconductor light-emitting device disposing the semiconductor light-emitting element. In the case, a flip-chip bonding can be applicable.

Furthermore, in the embodiments and the modifications, the semiconductor light-emitting element is composed of GaN crystal or InGaN crystal, for example. However, a compound combined with at least one of Al, In, Ga or B as a III-group element having a peak of emission wave length being near 370 nm and N as a V-group element, SiC or the like can be constituted as a semiconductor light-emitting element.

Furthermore, in the embodiments and the modifications, a pair of two or three stripes is demonstrated as a semiconductor light-emitting element. However, one stripe or a pair of more than three stripes can be applicable as a semiconductor light-emitting element. As another case, directions of a stripe having two or three are demonstrated for example. However, directions of a stripe having more than four can be applicable as a semiconductor light-emitting element.

Furthermore, in the embodiments and the modifications, a stripe has a ridge-type structure. However, another reflection-index guide-wave type stripe structure or the like can be used, for example, buried type or the like. Further, a gain guide-wave type stripe structure or the like can also be applicable.

Furthermore, in the embodiments and the modifications, a SMD-type is demonstrated as a semiconductor light-emitting device. However, a structure called a shell-type or a radial-type can be applicable.

What is claimed is:

1. A semiconductor light-emitting element, comprising:
   at least four end portions, each end portion including a plurality of stripes being formed on a layered structure having a substrate, an n-type clad-layer, an active layer and a p-type clad-layer in order, the stripes being constituted with a plurality of first stripes and a plurality of second stripes, the first stripes being parallel configured in one pair of the end portions being opposed each other, the second stripes being parallel configured in the other pair of the end portions being opposed each other.

2. The semiconductor light-emitting element according to claim 1, wherein
an angle between the first stripe direction and the second stripe direction is approximately ninety degrees.

3. The semiconductor light-emitting element according to claim 1, further comprising:
a pair of two end portions being opposed each other, each of the two end portions including a plurality of third stripes being parallel configured on the layered structure.

4. The semiconductor light-emitting element according to claim 1, wherein
the first stripe and the second stripe are crossing each other.

5. The semiconductor light-emitting element according to claim 1, further comprising:
a diffraction grating being formed on the p-type clad-layer.

6. The semiconductor light-emitting element according to claim 5, wherein
emission wave length of the diffraction grating is approximately 370 nm.

7. A semiconductor light-emitting element, comprising:
at least six end portions, each end portion including a plurality of stripes being formed on a layered structure having a substrate, an n-type clad-layer, an active layer and a p-type clad-layer in order, the stripes being constituted with a plurality of first stripes, a plurality of second stripes and a plurality of third stripes, the first stripes being configured perpendicular to a first pair of the side portions being opposed each other, the second stripes being configured perpendicular to a second pair of the side portions being opposed each other, the third stripes being configured perpendicular to a third pair of the side portions being opposed each other.

8. The semiconductor light-emitting element according to claim 7, wherein
an angle between two stripe directions being adjacent to each other is approximately sixty degrees.

9. The semiconductor light-emitting element according to claim 7, wherein the first stripe, the second stripe, and the third stripe are crossing each other.

10. A semiconductor light-emitting device, comprising:
a semiconductor light-emitting element, the semiconductor light-emitting element including at least four end portions, each end portion including a plurality of stripes being formed on a layered structure having a substrate, an n-type clad-layer, an active layer and a p-type clad-layer in order, the stripes being constituted with a plurality of first stripes and a plurality of second stripes, the first stripes being parallel configured in one pair of the end portions being opposed each other, the second stripes being parallel configured in the other pair of the end portions being opposed each other;
a lead, the lead being electrically connected with the semiconductor light-emitting element;
a package body being a concave portion, the package body having a side-wall as a inner-side surface, the semiconductor light-emitting element being disposed on a center of a bottom surface in the concave portion, the light emitted from the stripes of the semiconductor light-emitting element being irradiated with the inner-side surface;
a reflection film for ultraviolet at least on the inner-side surface and a fluorescence material on the reflection film being formed; and
a cap substantially being transparent for visible-light and substantially being opaque against ultraviolet, the cap being disposed an upper portion of the semiconductor light-emitting element opposed to the bottom surface.

11. The semiconductor light-emitting device according to claim 10, further comprising:
a pair of two end portions being opposed each other, each of the two end portions including a plurality of third stripes being parallel configured on the layered structure.

12. The semiconductor light-emitting device according to claim 10, wherein
an angle between the first stripe direction and the second stripe direction is approximately ninety degrees.

13. The semiconductor light-emitting device according to claim 11, wherein
an angle between the first stripe direction and the second stripe direction is approximately sixty degrees.

14. The semiconductor light-emitting according to claim 11, wherein
the first stripe and the second stripe are crossing each other.

15. A semiconductor light-emitting device, comprising:
a semiconductor light-emitting element, the semiconductor light-emitting element including at least six end portions, each end portion including a plurality of stripes being formed on a layered structure having a substrate, an n-type clad-layer, an active layer and a p-type clad-layer in order, the stripes being constituted with a plurality of first stripes, a plurality of second stripes and a plurality of third stripes, the first stripes being configured perpendicular to a first pair of the side portions being opposed each other, the second stripes being configured perpendicular to a second pair of the side portions being opposed each other, the third stripes being configured perpendicular to a third pair of the side portions being opposed each other;
a lead, the lead being electrically connected with the semiconductor light-emitting element;
a package body being a concave portion, the package body having a side-wall as a inner-side surface, the semiconductor light-emitting element being disposed on a center of a bottom surface in the concave portion, the light emitted from the stripes of the semiconductor light-emitting element being irradiated with the inner-side surface;
a reflection film for ultraviolet at least on the inner-side surface and a fluorescence material on the reflection film being formed; and
a cap substantially being transparent for visible-light and substantially being opaque against ultraviolet, the cap being disposed an upper portion of the semiconductor light-emitting element opposed to the bottom surface.

16. The semiconductor light-emitting device according to claim 15, wherein
an angle between two stripe directions in the first stripe direction, the second stripe direction and the third stripe direction is approximately sixty degrees.

17. The semiconductor light-emitting device according to claim 15, wherein
the first stripe, the second stripe, and the third stripe are crossing each other.

* * * * *